United States Patent
Nagami et al.

(10) Patent No.: US 10,615,005 B2
(45) Date of Patent: Apr. 7, 2020

(54) PLASMA GENERATING METHOD

(71) Applicant: TOKYO ELECTRON LIMITED, Tokyo (JP)

(72) Inventors: Koichi Nagami, Miyagi (JP); Kazunobu Fujiwara, Miyagi (JP); Tadashi Gondai, Miyagi (JP); Norikazu Yamada, Miyagi (JP); Naoyuki Umehara, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/382,586

(22) Filed: Apr. 12, 2019

(65) Prior Publication Data
US 2019/0318915 A1    Oct. 17, 2019

(30) Foreign Application Priority Data

Apr. 12, 2018  (JP) .................................. 2018-077052

(51) Int. Cl.
*H01J 37/32* (2006.01)
*H05H 1/46* (2006.01)

(52) U.S. Cl.
CPC .. *H01J 37/32183* (2013.01); *H01J 37/32091* (2013.01); *H01J 37/32577* (2013.01); *H05H 1/46* (2013.01); *H05H 2001/4675* (2013.01); *H05H 2001/4682* (2013.01)

(58) Field of Classification Search
None
See application file for complete search history.

(56) References Cited

U.S. PATENT DOCUMENTS

| | | | | |
|---|---|---|---|---|
| 5,726,603 A * | 3/1998 | Chawla | ................... | H03F 1/301 330/269 |
| 6,313,584 B1 * | 11/2001 | Johnson | ............ | H01J 37/32082 315/111.21 |
| 6,313,587 B1 * | 11/2001 | MacLennan | .......... | H01J 61/025 315/224 |
| 6,703,080 B2 * | 3/2004 | Reyzelman | ....... | H01J 37/32082 118/723 E |
| 7,569,154 B2 * | 8/2009 | Gondai | ............ | H01J 37/32082 216/67 |
| 7,700,465 B2 * | 4/2010 | Collins | ............. | H01J 37/32082 257/E21.001 |

(Continued)

FOREIGN PATENT DOCUMENTS

JP          5578374 B2     8/2014

*Primary Examiner* — Alexander H Taningco
*Assistant Examiner* — Srinivas Sathiraju
(74) *Attorney, Agent, or Firm* — Rothwell, Figg, Ernst & Manbeck, P.C.

(57) ABSTRACT

In a method of an embodiment, radio-frequency power is supplied to an electrode via a matching device from a radio-frequency power supply in order to generate plasma within a chamber. During the supply of the radio-frequency power, it is determined whether or not plasma is generated within the chamber from one or more parameters reflecting plasma generation within the chamber. When it is determined that plasma is not generated, a frequency of the radio-frequency power output from the radio-frequency power supply is adjusted to set the load side reactance of the radio-frequency power supply to zero or to bring the load side reactance close to zero.

6 Claims, 9 Drawing Sheets

(56) References Cited

U.S. PATENT DOCUMENTS

| | | | | |
|---|---|---|---|---|
| 9,011,636 B2* | 4/2015 | Ashida | | C23C 16/50 |
| | | | | 118/663 |
| 9,043,525 B2* | 5/2015 | Valcore, Jr. | | G06F 13/40 |
| | | | | 710/305 |
| 9,263,350 B2* | 2/2016 | Kapoor | | H01L 21/0262 |
| 9,337,804 B2* | 5/2016 | Mason | | H01J 37/32183 |
| 9,536,713 B2* | 1/2017 | Van Zyl | | H01J 37/3299 |
| 9,736,921 B2* | 8/2017 | Nagami | | H01J 37/32091 |
| 9,875,881 B2* | 1/2018 | Nagami | | H01J 37/32091 |
| 9,960,016 B2* | 5/2018 | Ono | | H01J 37/32174 |
| 9,973,940 B1* | 5/2018 | Rappaport | | H03H 7/40 |
| 10,224,184 B2* | 3/2019 | Van Zyl | | H01J 37/32146 |
| 10,229,816 B2* | 3/2019 | Coumou | | H03F 3/189 |
| 10,276,344 B2* | 4/2019 | Sung | | H01J 37/24 |
| 2003/0215373 A1* | 11/2003 | Reyzelman | | H01J 37/32082 |
| | | | | 422/186.29 |
| 2006/0005928 A1* | 1/2006 | Howald | | H01J 37/32082 |
| | | | | 156/345.48 |
| 2010/0072172 A1* | 3/2010 | Ui | | H01J 37/32009 |
| | | | | 216/67 |
| 2011/0006040 A1* | 1/2011 | Savas | | C23C 16/24 |
| | | | | 216/71 |
| 2012/0247677 A1* | 10/2012 | Himori | | H01J 37/32091 |
| | | | | 156/345.44 |
| 2013/0169359 A1* | 7/2013 | Coumou | | H03F 3/191 |
| | | | | 330/192 |
| 2014/0361690 A1* | 12/2014 | Yamada | | H01J 37/32091 |
| | | | | 315/111.21 |
| 2016/0168701 A1* | 6/2016 | Kapoor | | H01L 21/0262 |
| | | | | 118/663 |
| 2017/0069465 A1* | 3/2017 | Bock | | H03H 7/40 |
| 2017/0104426 A1* | 4/2017 | Mills | | H02S 40/32 |
| 2017/0278675 A1* | 9/2017 | Ono | | H01J 37/32174 |
| 2017/0345620 A1* | 11/2017 | Coumou | | H01J 37/32183 |
| 2018/0366305 A1* | 12/2018 | Nagami | | H01J 37/32385 |
| 2019/0122863 A1* | 4/2019 | Nagaseki | | H01J 37/32174 |

* cited by examiner

PLASMA GENERATING METHOD

CROSS-REFERENCE TO RELATED APPLICATIONS

This application is based on and claims priority from Japanese Patent Application No. 2018-077052, filed on Apr. 12, 2018 with the Japan Patent Office, the disclosures of which are incorporated herein in their entireties by reference.

TECHNICAL FIELD

Embodiments of the present disclosure relate to a plasma generating method.

BACKGROUND

In the manufacture of electronic devices, a plasma processing apparatus is used. The plasma processing apparatus includes a chamber, an electrode, a radio-frequency power supply, and a matching device. In order to excite the gas within the chamber to generate plasma, radio-frequency power is given from the radio-frequency power supply to the electrode. The matching device is configured to match the impedance on the load side of the radio-frequency power supply to the output impedance of the radio-frequency power supply.

As for the matching device, a mechanically controlled matching device is generally used. The mechanically controlled matching device includes a capacitor driven by a motor to change the capacitance thereof. The control speed of the impedance of the mechanically controlled matching device is limited by the control speed of the capacitance of the capacitor by the motor.

As for another matching device, an electronically controlled matching device is known. The electronically controlled matching device includes a plurality of first series circuits and a plurality of second series circuits. The plurality of first series circuits is connected in parallel to each other. The plurality of second series circuits is connected in parallel to each other. In each of the plurality of first series circuits and the plurality of second series circuits, a capacitor and a switching element are connected in series. The electronically controlled matching device is capable of changing the impedance by the electronic control of the switching element of each of the plurality of first series circuits and the switching element of each of the plurality of second series circuits. Accordingly, the control speed of the impedance of the electronically controlled matching device is high. An electronically controlled matching device is described in Japanese Patent No. 5578374.

SUMMARY

In an aspect, a plasma generating method includes: providing a plasma processing apparatus including a chamber; a radio-frequency power supply; an electrode electrically connected to the radio-frequency power supply to generate plasma within the chamber; and a matching device provided between the radio-frequency power supply and the electrode in order to match a load side impedance of the radio-frequency power supply with an output impedance of the radio-frequency power supply, the matching device including a plurality of first series circuits connected in parallel to each other and each including a capacitor and a switching element connected to the capacitor in series, and a plurality of second series circuits connected in parallel to each other and each including a capacitor and a switching element connected to the capacitor in series; supplying radio-frequency power to the electrode via the matching device from the radio-frequency power supply in order to generate plasma within the chamber; determining whether or not plasma is generated within the chamber from one or more parameters reflecting plasma generation within the chamber during the supplying the radio-frequency power; matching the load side impedance with the output impedance of the radio-frequency power by the matching device; and when it is determined that plasma is not generated within the chamber in the determining, adjusting a frequency of the radio-frequency power output from the radio-frequency power supply so as to set the load side reactance of the radio-frequency power supply to zero or to bring the load side reactance close to zero.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
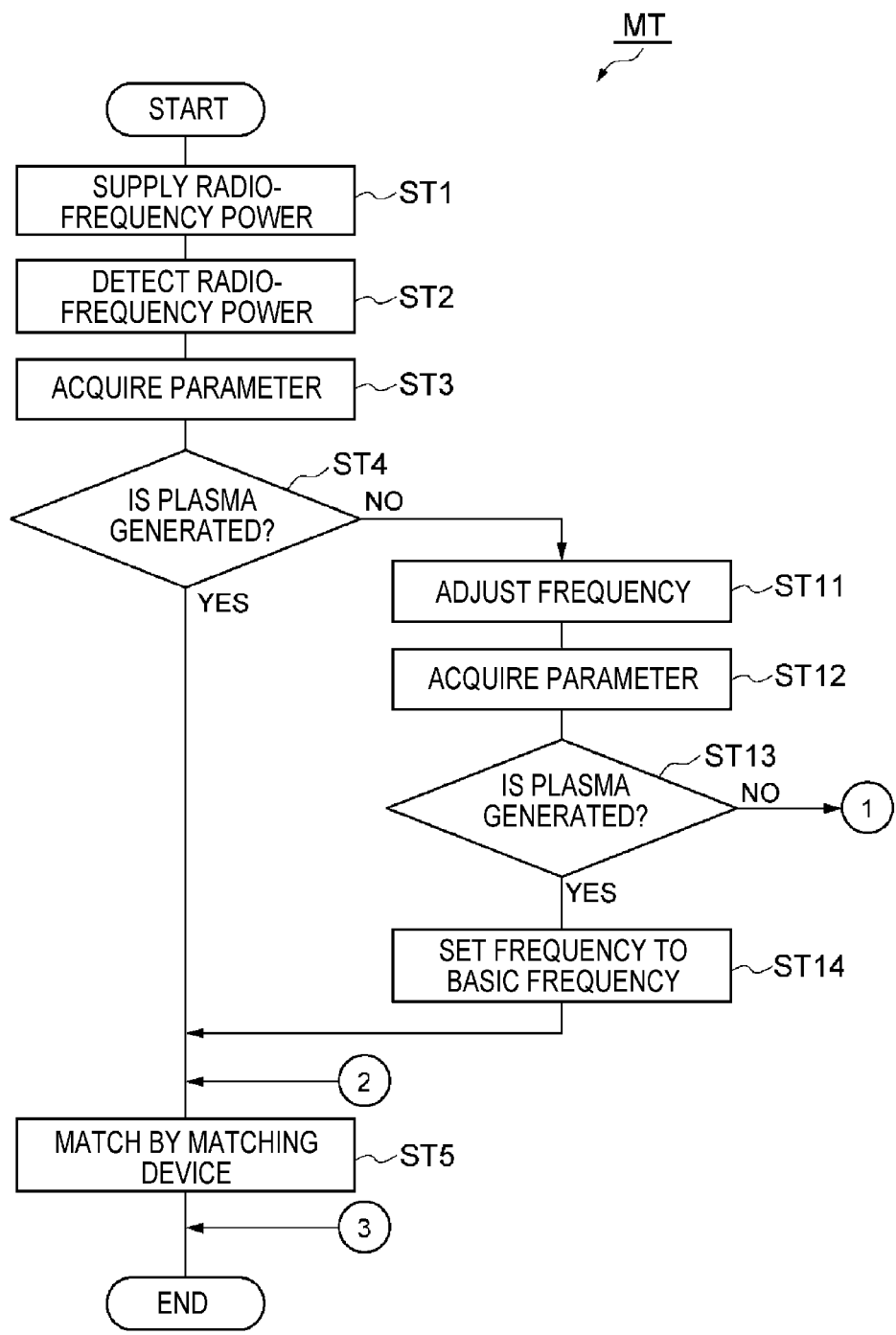
FIG. 1 is a flowchart illustrating a method of generating plasma according to an embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In an aspect, a plasma generating method is provided to generate a plasma within a chamber of a plasma processing apparatus. The plasma processing apparatus includes a chamber, a radio-frequency power supply, an electrode, and a matching device. The electrode is electrically connected to the radio-frequency power supply to generate plasma in the chamber. The matching device is provided between the radio-frequency power supply and the electrode in order to match the impedance on the load side of the radio-frequency power supply with the output impedance of the radio-frequency power supply. The matching device includes a plurality of first series circuits and a plurality of second series circuits. The plurality of first series circuits is connected in parallel to each other. The plurality of second series circuits is connected in parallel to each other. Each of the plurality of first series circuits and the plurality of second series circuits includes a capacitor and a switching element. In each of the plurality of first series circuits and the plurality of second series circuits, the capacitor and the switching element are connected in series.

The method according to the aspect includes: (i) supplying radio-frequency power from a radio-frequency power supply to an electrode via a matching device; (ii) determining whether plasma is generated within the chamber from one or more parameters reflecting plasma generation within the chamber during the supplying the radio-frequency power; and (iii) matching a load side impedance with the output impedance of the radio-frequency power supply. When it is determined that plasma is not generated within the chamber in the determining, a step of adjusting the frequency of the radio-frequency power output from the radio-frequency power supply is executed to set the load side reactance of the radio-frequency power supply to zero or to bring the load side reactance close to zero.

In the method according to an aspect, when a phenomenon in which plasma is not generated occurs, the frequency of the radio-frequency power is adjusted to set the load side reactance of the radio-frequency power supply generated by the radio-frequency power supply to zero or to bring the load side reactance close to zero. The radio-frequency power supply is capable of adjusting the frequency of the radio-frequency power at high speed. Accordingly, when the phenomenon in which plasma is not generated occurs, the reflection of the radio-frequency power is suppressed within a short time.

In an embodiment, the method further includes changing the frequency of the radio-frequency power output from the radio-frequency power supply and determining the frequency of the radio-frequency power that generates plasma within the chamber when it is determined that plasma is not generated within the chamber from the one or more parameters after executing the step of adjusting the frequency of the radio-frequency power.

In an embodiment of the changing the frequency of the radio-frequency power, the frequency of the radio-frequency power is swept. In another embodiment of the changing the frequency of the radio-frequency power, the frequency is sequentially set to a plurality of frequencies.

In an embodiment, the one or more parameters are one or more parameters selected from a peak value of a power of the radio-frequency power, a phase difference between a voltage and a current of the radio-frequency power, a magnitude of the load side impedance, a power level of a traveling wafer, a power level of a reflected wave, and a light emission amount within the chamber.

Hereinafter, various embodiments will be described in detail with reference to the drawings. In each drawing, the same or corresponding components will be denoted by the same symbols.

Figure 2:
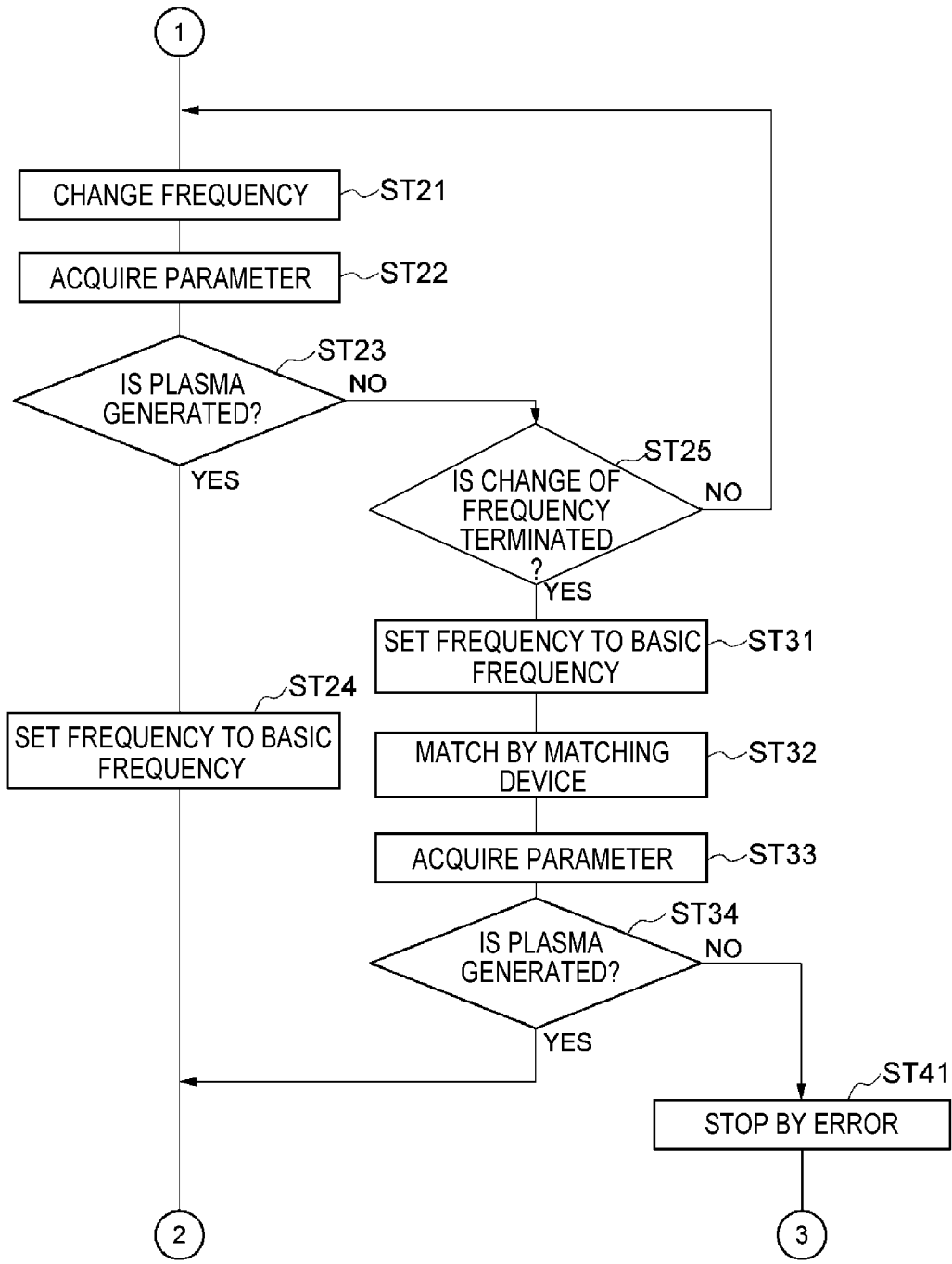
FIG. 2 is a flowchart illustrating a method of generating plasma according to an embodiment.

FIGS. 1 and 2 are flowcharts each illustrating a method of generating plasma according to an embodiment. Method MT illustrated in FIGS. 1 and 2 is carried out to generate plasma in the chamber of a plasma processing apparatus.

Figure 3:
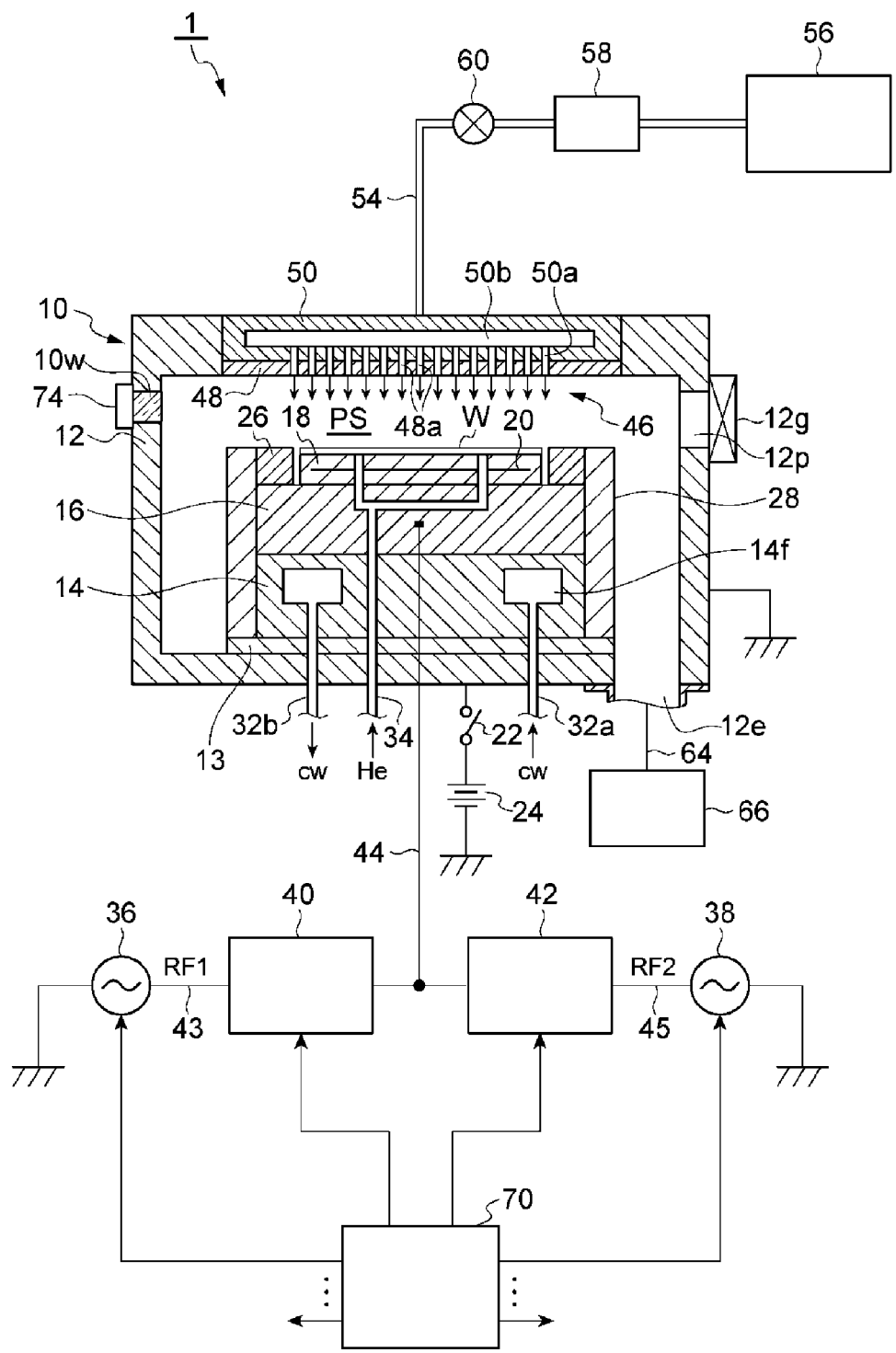
FIG. 3 is a view schematically illustrating an exemplary plasma processing apparatus to which the methods illustrated in FIGS. 1 and 2 are applicable.

FIG. 3 is a view schematically illustrating an exemplary plasma processing apparatus to which the methods illustrated in FIGS. 1 and 2 are applicable. The plasma processing apparatus 1 illustrated in FIG. 3 is a capacitively coupled plasma processing apparatus. The plasma processing apparatus 1 includes a chamber 10. The chamber 10 provides an inner space.

The chamber 10 includes a chamber body 12. The chamber body 12 has a substantially cylindrical shape. The inner space of the chamber 10 is provided inside the chamber body 12. The chamber body 12 is made of a material such as, for example, aluminum. The inner surface of the chamber body 12 is anodized. The chamber body 12 is grounded. An opening 12p is formed in the side wall of the chamber body 12. A substrate W passes through the opening 12p when the substrate W is transported between the inner space of the chamber 10 and the outside of the chamber 10. The opening 12p is openable/closable by a gate valve 12g. The gate valve 12g is provided along the side wall of the chamber body 12.

A window 10w is provided in the wall of the chamber 10, for example the side wall of the chamber body 12. The window 10w is formed of an optically transparent member. Light generated in the chamber 10 passes through the window 10w and is output to the outside of the chamber 10. The plasma processing apparatus 1 further includes an optical sensor 74. The optical sensor 74 is disposed outside the chamber 10 so as to face the window 10w. The optical sensor 74 is configured to monitor a light emission amount in the inner space of the chamber 10 (e.g., a processing region PS to be described later). The optical sensor 74 may be, for example, an emission spectroscopic analyzer. The optical sensor 74 may be provided within the chamber 10.

An insulating plate 13 is provided on the bottom of the chamber body 12. The insulating plate 13 is made of, for example, ceramic. A support base 14 is provided on the insulating plate 13. The support base 14 has a substantially cylindrical shape. A susceptor 16 is provided on the support base 14. The susceptor 16 is made of a conductive material such as, for example, aluminum. The susceptor 16 constitutes a lower electrode. The susceptor 16 may be electrically connected to a radio-frequency power supply to be described later in order to generate plasma in the chamber 10.

An electrostatic chuck 18 is provided on the susceptor 16. The electrostatic chuck 18 is configured to hold a substrate W placed thereon. The electrostatic chuck 18 has a main body and an electrode 20. The main body of the electrostatic chuck 18 is formed of an insulator and has a substantially disc shape. The electrode 20 is a conductive film and is provided in the main body of the electrostatic chuck 18. A DC power supply 24 is electrically connected to the electrode 20 via a switch 22. When a DC voltage is applied from the DC power supply 24 to the electrode 20, an electrostatic attractive force is generated between the substrate W and the electrostatic chuck 18. The substrate W is attracted to the electrostatic chuck 18 by the generated electrostatic attractive force and held by the electrostatic chuck 18.

A focus ring 26 is arranged around the electrostatic chuck 18 and on the susceptor 16. The focus ring 26 is disposed so as to surround the edge of the substrate W. A cylindrical inner wall member 28 is attached to the outer peripheral surfaces of the susceptor 16 and the support base 14. The inner wall member 28 is made of, for example, quartz.

A flow path 14f is formed inside the support base 14. The flow path 14f extends, for example, in a spiral shape with respect to a central axis that extends in the vertical direction.

A heat exchange medium cw (e.g., a coolant such as cooling water) is supplied to the flow path 14f from a supply device (e.g., a chiller unit) provided outside the chamber 10 via a pipe 32a. The heat exchange medium supplied to the flow path 14f is collected in the supply device via a pipe 32b. By adjusting the temperature of the heat exchange medium by the supply device, the temperature of the substrate W is adjusted. In addition, the plasma processing apparatus 1 is provided with a gas supply line 34. The gas supply line 34 is provided to supply a heat transfer gas (e.g., He gas) to a portion between the upper surface of the electrostatic chuck 18 and the rear surface of the substrate W.

A conductor 44 (e.g., a power feeding rod) is connected to the susceptor 16. A radio-frequency power supply 36 is connected to the conductor 44 via a matching device 40. A radio-frequency power supply 38 is connected to the conductor 44 via a matching device 42. That is, the radio-frequency power supply 36 is connected to the lower electrode via the matching device 40 and the conductor 44. The radio-frequency power supply 38 is connected to the lower electrode via the matching device 42 and the conductor 44. The radio-frequency power supply 36 may be connected not to the lower electrode, but to the upper electrode to be described later via the matching device 40. The plasma processing apparatus 1 may not include any one of the set of the radio-frequency power supply 36 and the matching device 40 and the set of the radio-frequency power supply 38 and the matching device 42.

The radio-frequency power supply 36 outputs radio-frequency power RF1 for plasma generation. The basic frequency $f_{B1}$ of the radio-frequency power RF1 is, for example, 100 MHz. The radio-frequency power supply 38 outputs radio-frequency power RF2 for drawing ions from the plasma into the substrate W. The frequency of the radio-frequency power RF2 is lower than the frequency of the radio-frequency power RF1. The basic frequency $f_{B2}$ of the radio-frequency power RF2 is, for example, 13.56 MHz.

The matching device 40 has a circuit for matching the impedance on the load side (e.g., the lower electrode side) of the radio-frequency power supply 36 with the output impedance of the radio-frequency power supply 36. The matching device 42 has a circuit for matching the impedance on the load side (the lower electrode side) of the radio-frequency power supply 38 with the output impedance of the radio-frequency power supply 38. Each of the matching device 40 and the matching device 42 is an electronically controlled matching device. Details of each of the matching device 40 and the matching device 42 will be described later.

The matching device 40 and the conductor 44 constitute a part of a power feeding line 43. The radio-frequency power RF1 is supplied to the susceptor 16 via the power feeding line 43. The matching device 42 and the conductor 44 constitute a part of a power feeding line 45. The radio-frequency power RF2 is supplied to the susceptor 16 via the power feeding line 45.

The ceiling portion of the chamber 10 is constituted by an upper electrode 46. The upper electrode 46 is provided to close the opening at the upper end of the chamber body 12. The inner space of the chamber 10 includes a processing region PS. The processing region PS is a space between the upper electrode 46 and the susceptor 16. The plasma processing apparatus 1 generates plasma in the processing region PS by a radio-frequency electric field generated between the upper electrode 46 and the susceptor 16. The upper electrode 46 is grounded. When the radio-frequency power supply 36 is connected not to the lower electrode but to the upper electrode 46 via the matching device 40, the upper electrode 46 is not grounded, and the upper electrode 46 and the chamber body 12 are electrically isolated.

The upper electrode 46 includes a ceiling plate 48 and a support 50. A plurality of gas ejection holes 48a are formed in the ceiling plate 48. The ceiling plate 48 is made of a silicon-based material such as, for example, Si or SiC. The support 50 is a member that detachably supports the ceiling plate 48, and is made of aluminum. The support 50 is anodized on the surface thereof.

A gas buffer chamber 50b is formed inside the support 50. In addition, a plurality of gas holes 50a is formed in the support 50. Each of the plurality of gas holes 50a extends from the gas buffer chamber 50b and communicates with one of the plurality of gas ejection holes 48a. A gas supply pipe 54 is connected to the gas buffer chamber 50b. The gas supply pipe 54 is connected with a gas source 56 via a flow rate controller 58 (e.g., a mass flow controller) and an opening/closing valve 60. The gas from the gas source 56 is supplied to the inner space of the chamber 10 via the flow rate controller 58, the opening/closing valve 60, the gas supply pipe 54, the gas buffer chamber 50b, and the plurality of gas ejection holes 48a. The flow rate of the gas supplied from the gas source 56 to the inner space of the chamber 10 is adjusted by the flow rate controller 58.

An exhaust port 12e is provided in the bottom of the chamber body 12 below the space between the susceptor 16 and the side wall of the chamber body 12. An exhaust pipe 64 is connected to the exhaust port 12e. The exhaust pipe 64 is connected to an exhaust device 66. The exhaust device 66 includes a pressure regulating valve and a vacuum pump such as, for example, a turbo molecular pump. The exhaust device 66 decompresses the inner space of the chamber 10 to a designated pressure.

The plasma processing apparatus 1 further includes a main controller 70. The main controller 70 includes one or more microcomputers. The main controller 70 may include, for example, a processor, a storage device such as a memory, an input device such as a keyboard, a display device, and a signal input/output interface. The processor of the main controller 70 executes software (program) stored in the storage device and controls, based on recipe information, individual operations of respective parts of the plasma processing apparatus 1, for example, the radio-frequency power supply 36, the radio-frequency power supply 38, the matching device 40, the matching device 42, the flow rate controller 58, the opening/closing valve 60, the exhaust device 66, and the optical sensor 74, and the operation (a sequence) of the entire apparatus of the plasma processing apparatus 1. Method MT to be described later is executed by the control of each part of the plasma processing apparatus 1 by the main controller 70.

When the plasma processing is performed in the plasma processing apparatus 1, the gate valve 12g is first opened. Subsequently, the substrate W is loaded into the chamber 10 via the opening 12p and placed on the electrostatic chuck 18. Then, the gate valve 12g is closed. Next, the processing gas is supplied from the gas source 56 to the inner space of the chamber 10, and the exhaust device 66 is activated to set the pressure in the inner space of the chamber 10 to a designated pressure. In addition, the radio-frequency power RF1 and/or the radio-frequency power RF2 are supplied to the susceptor 16. In addition, a DC voltage is applied from the DC power supply 24 to the electrode 20 of the electrostatic chuck 18, and the substrate W is held by the electrostatic chuck 18. Then, the processing gas is excited by a radio-frequency electric field formed between the susceptor 16 and the upper electrode 46. As a result, plasma is generated in the processing region PS.

Figure 4:
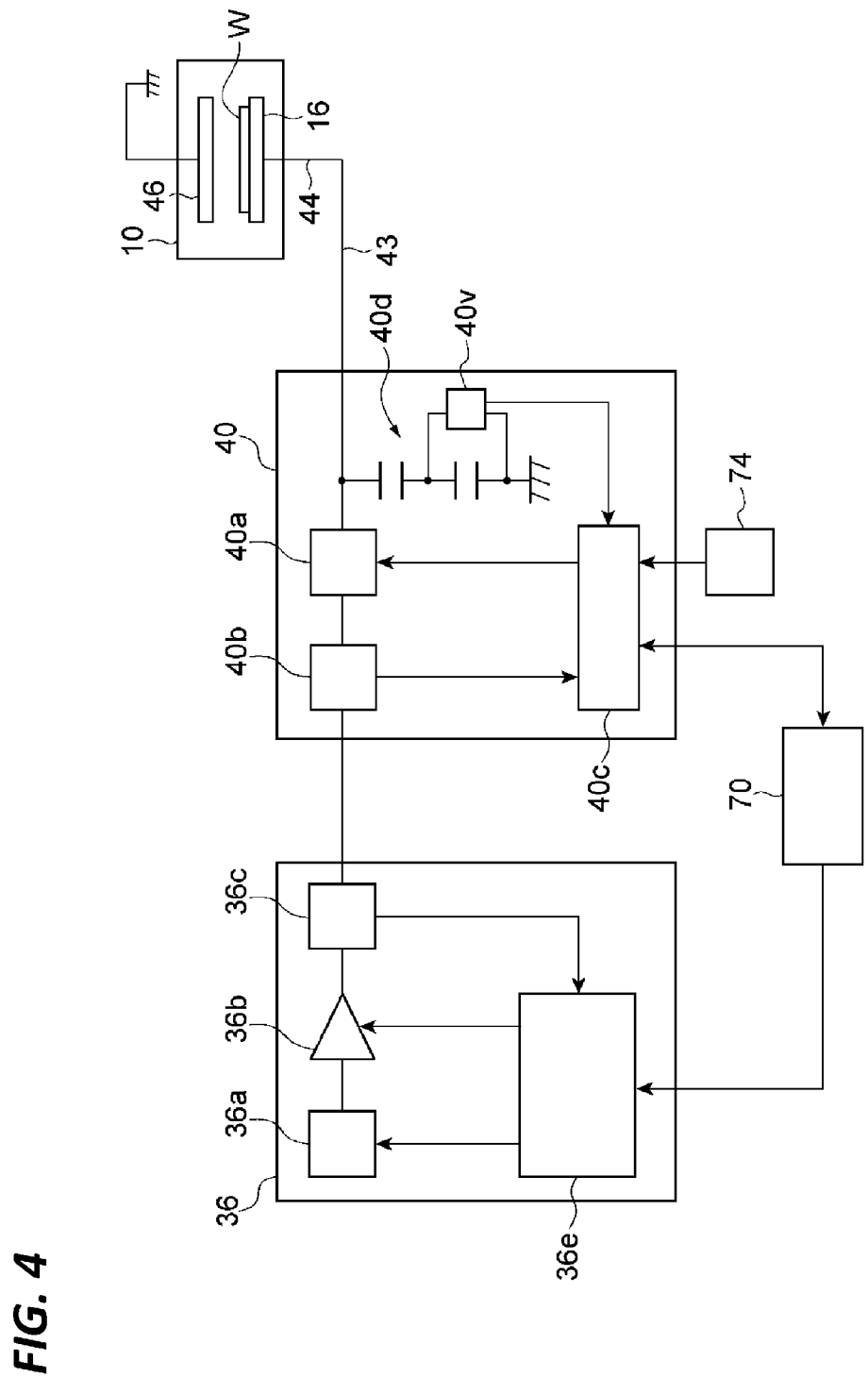
FIG. 4 is a view illustrating exemplary configurations of a radio-frequency power supply 36 and a matching device 40 of the plasma processing apparatus illustrated in FIG. 3.
Figure 5:
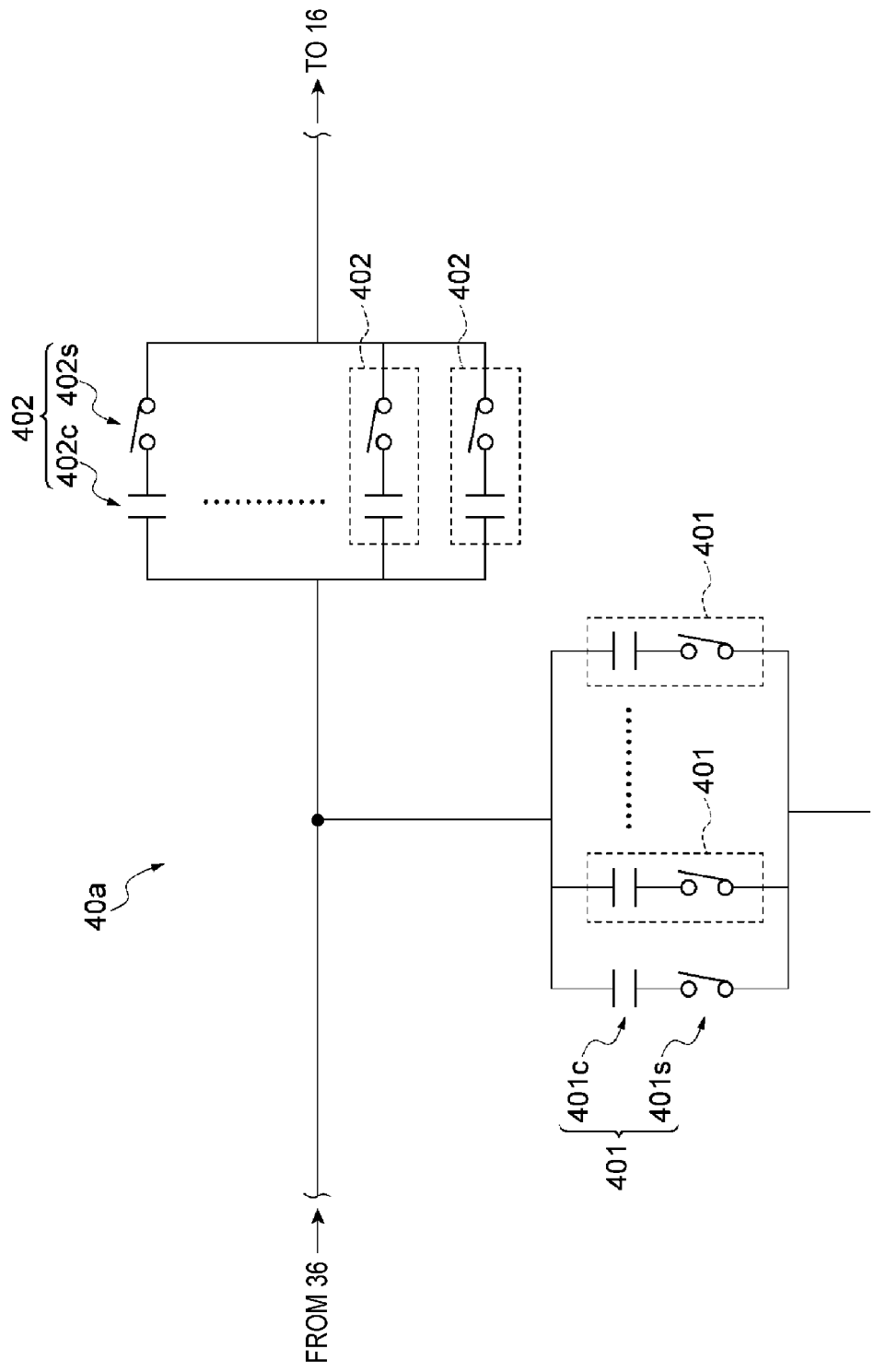
FIG. 5 is a view illustrating an exemplary matching circuit of the matching device 40 of the plasma processing apparatus illustrated in FIG. 3.
Figure 6:
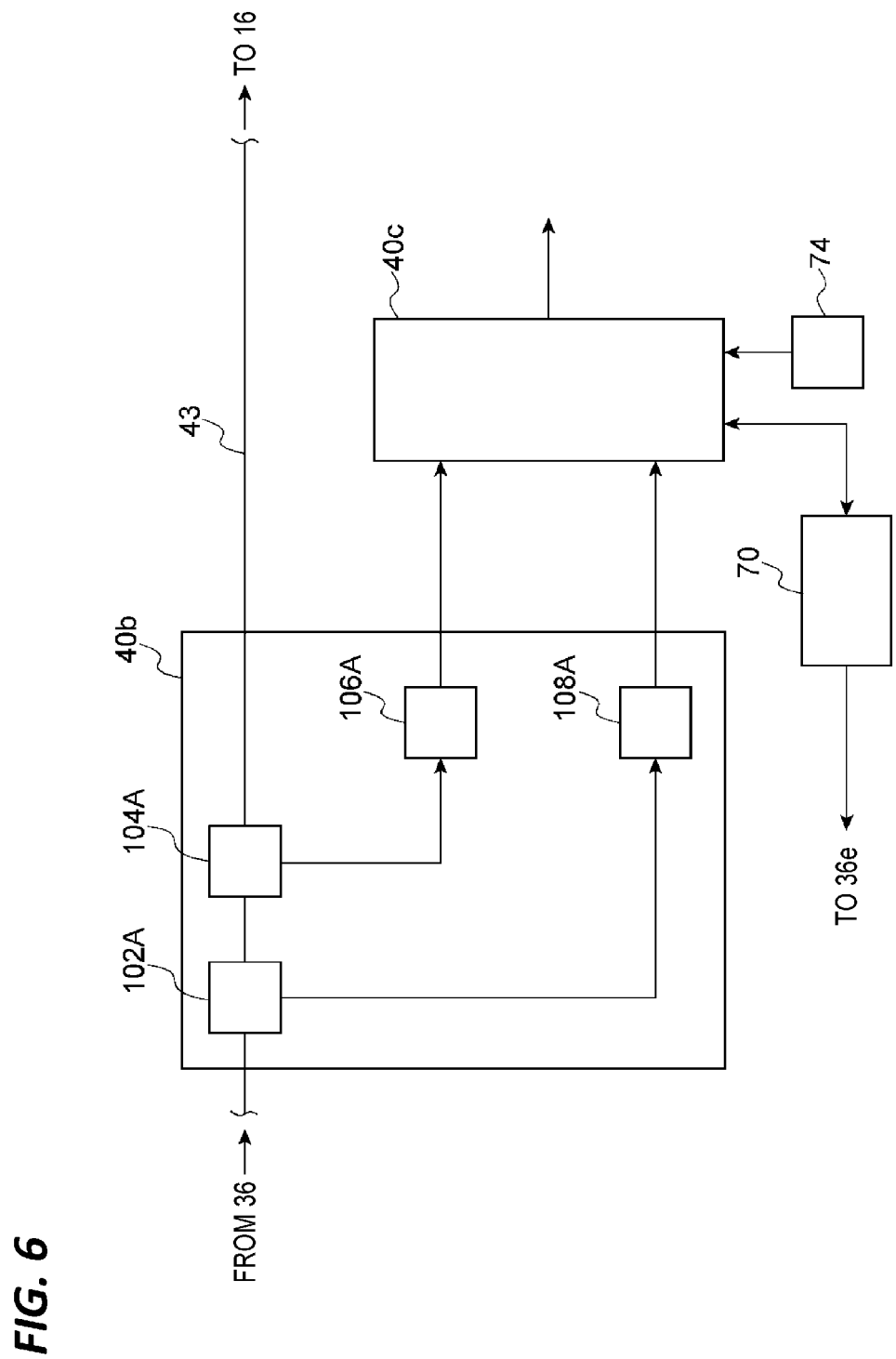
FIG. 6 is a view illustrating an exemplary configuration of the matching device 40 of the plasma processing apparatus illustrated in FIG. 3.
Figure 7:
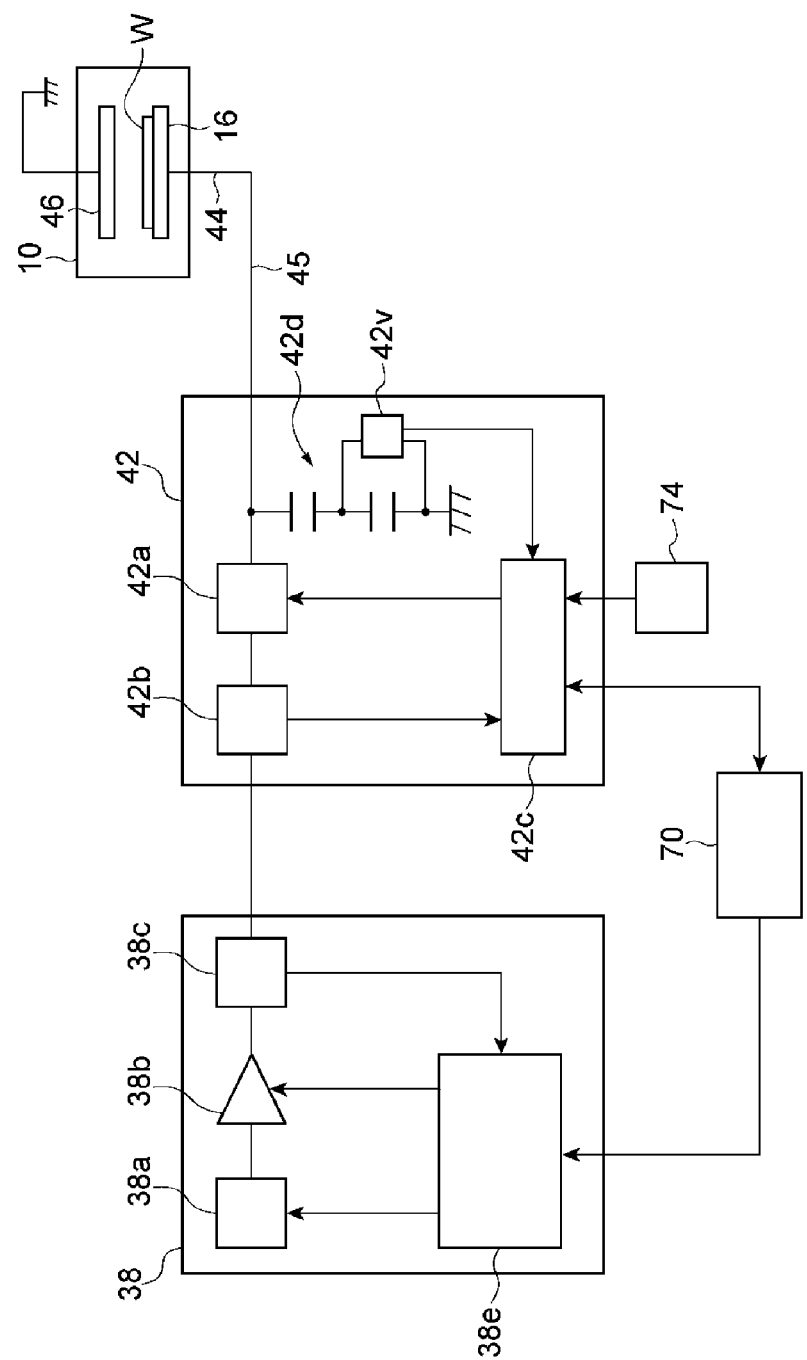
FIG. 7 is a view illustrating exemplary configurations of the radio-frequency power supply 38 and the matching device 42 of the plasma processing apparatus illustrated in FIG. 3.
Figure 8:
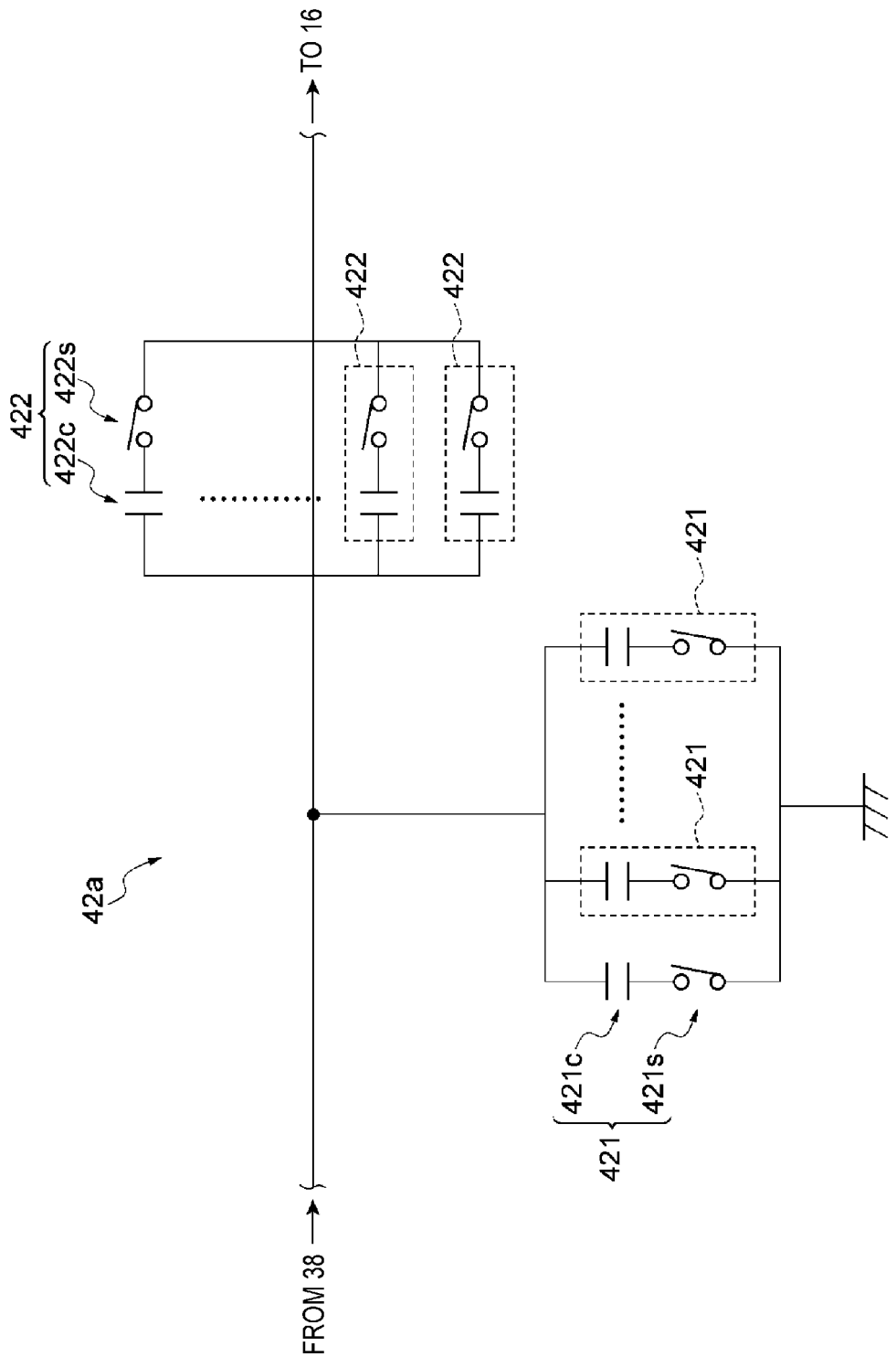
FIG. 8 is a view illustrating an exemplary matching circuit of the matching device 42 of the plasma processing apparatus illustrated in FIG. 3.
Figure 9:
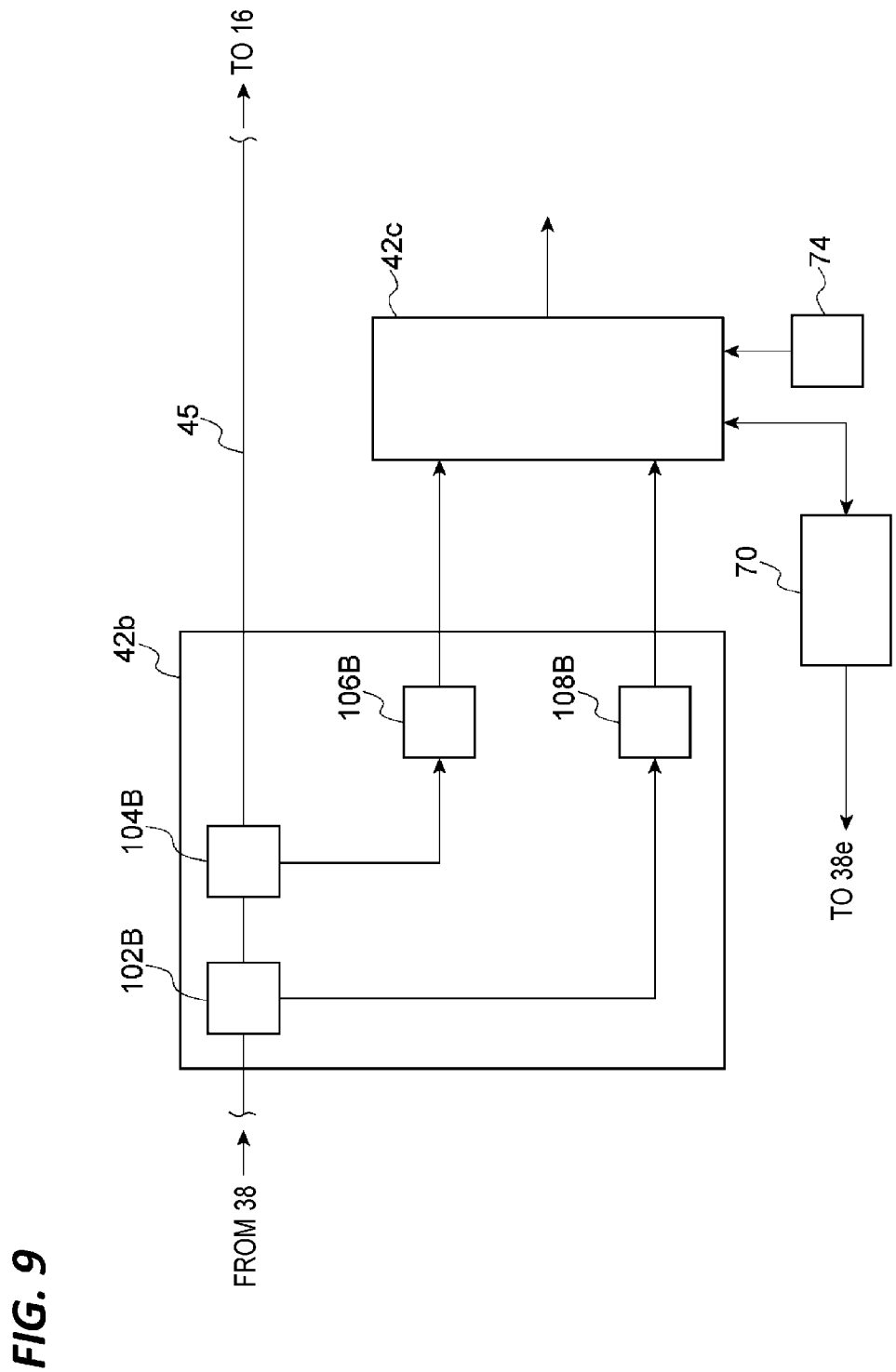
FIG. 9 is a view illustrating an exemplary configuration of the matching device 42 of the plasma processing apparatus illustrated in FIG. 3.

Hereinafter, the radio-frequency power supply 36, the matching device 40, the radio-frequency power supply 38, and the matching device 42 will be described in detail with reference to FIGS. 4 to 9. FIG. 4 is a view illustrating exemplary configurations of a radio-frequency power supply 36 and a matching device 40 of the plasma processing apparatus illustrated in FIG. 1. FIG. 5 is a view illustrating an exemplary matching circuit of the matching device 40 of the plasma processing apparatus illustrated in FIG. 1. FIG. 6 is a view illustrating an exemplary configuration of the matching device 40 of the plasma processing apparatus illustrated in FIG. 1. FIG. 7 is a view illustrating exemplary configurations of the radio-frequency power supply 38 and the matching device 42 of the plasma processing apparatus illustrated in FIG. 1. FIG. 8 is a view illustrating an exemplary matching circuit of the matching device 42 of the plasma processing apparatus illustrated in FIG. 1. FIG. 9 is a view illustrating an exemplary configuration of the matching device 42 of the plasma processing apparatus illustrated in FIG. 1.

As illustrated in FIG. 4, the radio-frequency power supply 36 includes an oscillator 36a, a power amplifier 36b, a power sensor 36c, and a power supply controller 36e. The power supply controller 36e is configured with a processor such as, for example, a CPU. The power supply controller 36e gives control signals to the oscillator 36a and the power amplifier 36b, respectively, using signals given from the main controller 70 and the power sensor 36c so as to control the oscillator 36a and the power amplifier 36b.

The signals given from the main controller 70 to the power supply controller 36e are a first power level setting signal and a first frequency setting signal. The first power level setting signal is a signal for designating the power level of the radio-frequency power RF1, and the first frequency setting signal is a signal for designating the setting frequency of the radio-frequency power RF1.

The power supply controller 36e controls the oscillator 36a so as to output a radio-frequency signal having the set frequency designated by the first frequency setting signal. The output of the oscillator 36a is connected to the input of the power amplifier 36b. The radio-frequency signal output from the oscillator 36a is input to the power amplifier 36b. The power amplifier 36b amplifies the input radio-frequency signal so as to generate the radio-frequency power RF1 having the power level designated by the first power level setting signal from the input radio-frequency signal. The power amplifier 36b outputs the generated radio-frequency power RF1.

A power sensor 36c is provided in a rear stage of the power amplifier 36b. The power sensor 36c has a directional coupler, a traveling wave detector, and a reflected wave detector. In the power sensor 36c, the directional coupler gives a part of the traveling wave of the radio-frequency power RF1 to the traveling wave detector, and gives the reflected wave to the reflected wave detector. To the power sensor 36c, a signal specifying the frequency of the radio-frequency power RF1 is given from the power supply controller 36e. The traveling wave detector of the power sensor 36c generates the measured value of the power level of the component having the same frequency as the set frequency of the radio-frequency power RF1 among all the frequency components of the traveling wave, that is, the measured value $P_{f11}$ of the power level of the traveling wave.

The measured value $P_{f11}$ is given to the power supply controller 36e for power feedback.

The reflected wave detector of the power sensor 36c generates the measured value of the power level of the component having the same frequency as the frequency of the radio-frequency power RF1 among all the frequency components of the reflected wave, that is, the measured value $P_{r11}$ of the power level of the reflected wave. The reflected wave detector of the power sensor 36c generates a measured value of the total power level of all the frequency components of the reflected wave, that is, the measured value $P_{r12}$ of the power level of the reflected wave. The measured value $P_{r11}$ is given to the main controller 70 for monitor display. The measured value $P_{r12}$ is given to the power supply controller 36e for protection of the power amplifier 36b.

The matching device 40 includes a matching circuit 40a, a sensor 40b, a controller 40c, a voltage dividing circuit 40d, and a voltage monitor 40v. The matching circuit 40a is an electronically controlled matching circuit. As illustrated in FIG. 5, the matching circuit 40a includes a plurality of series circuits 401 (a plurality of first series circuits) and a plurality of series circuits 402 (a plurality of second series circuits).

The plurality of series circuits 401 are connected in parallel to each other. In the example illustrated in FIG. 5, the plurality of series circuits 401 are connected in parallel between a node between the radio-frequency power supply 36 and the load side electrode (e.g., the lower electrode) and the ground. Each of the plurality of series circuits 401 includes a capacitor 401c and a switching element 401s. The capacitor 401c and the switching element 401s are connected in series. The switching element 401s is, for example, a PIN diode.

The plurality of series circuits 402 are connected in parallel to each other. In the example illustrated in FIG. 5, the plurality of series circuits 402 are connected in parallel between the radio-frequency power supply 36 and the load side electrode (e.g., the lower electrode). In a separate example, the plurality of series circuits 402 are connected in parallel between a separate node between the radio-frequency power supply 36 and the load side electrode (e.g., the lower electrode) and the ground. Each of the plurality of series circuits 402 includes a capacitor 402c and a switching element 402s. The capacitor 402c and the switching element 402s are connected in series. The switching element 402s is, for example, a PIN diode. The matching circuit 40a may further include, for example, an inductor.

Refer back to FIG. 4. The controller 40c is configured with, for example, a processor. The controller 40c operates under the control of the main controller 70. The controller 40c uses the measured value given from the sensor 40b.

As illustrated in FIG. 6, the sensor 40b includes a current detector 102A, a voltage detector 104A, a filter 106A, and a filter 108A. The voltage detector 104A detects a voltage waveform of the radio-frequency power RF1 transmitted on the power feeding line 43, and outputs a voltage waveform analog signal indicating the voltage waveform. This voltage waveform analog signal is input to the filter 106A. The filter 106A generates a voltage waveform digital signal by digitizing the input voltage waveform analog signal. Then, the filter 106A extracts only the component of the set frequency of the radio-frequency power RF1 specified by the signal from the main controller 70 from the voltage waveform digital signal, thereby generating a filtered voltage waveform signal. The filtered voltage waveform signal generated by the filter 106A is given to the controller 40c. In addition, the filter 106A is configured with, for example, a field programmable gate array (FPGA).

The current detector 102A detects a current waveform of the radio-frequency power RF1 transmitted on the power feeding line 43, and outputs a voltage waveform analog signal indicating the current waveform. This current waveform analog signal is input to the filter 108A. The filter 108A generates a current waveform digital signal by digitizing the input current waveform analog signal. Then, the filter 108A extracts only the component of the set frequency of the radio-frequency power RF1 specified by the signal from the main controller 70 from the current waveform digital signal, thereby generating a filtered current waveform signal. The filtered current waveform signal generated by the filter 108A is given to the controller 40c. In addition, the filter 108A is configured with, for example, a field programmable gate array (FPGA).

Refer back to FIG. 4. The controller 40c is configured to determine the load side impedance of the radio-frequency power supply 36 (hereinafter, referred to as "impedance $Z_1$"). The controller 40c controls the plurality of switching elements 401s and the plurality of switching elements 402s of the matching circuit 40a such that the obtained impedance $Z_1$ approaches the output impedance (matching point) of the radio-frequency power supply 36.

The controller 40c obtains the impedance $Z_1$ using the filtered voltage waveform signal given from the filter 106A and the filtered current waveform signal given from the filter 108A. Specifically, the controller 40c obtains the impedance $Z_1$ based on Equation (1) as follows.

$$Z_1 = V_1/I_1 \quad (1)$$

In Equation (1), $V_1$ is the voltage specified by the filtered voltage waveform signal given from the filter 106A, and $I_1$ is the current specified by the filtered current waveform signal given from the filter 108A.

The controller 40c is configured to determine whether or not plasma is generated in the chamber 10 during the supply of the radio-frequency power RF1 from the radio-frequency power supply 36. That is, the controller 40c is configured to determine whether or not plasma is generated in the chamber 10 after the supply of the radio-frequency power RF1 from the radio-frequency power supply 36 is initiated and the radio-frequency power RF1 is detected by the sensor 40b.

When it is determined that no plasma is generated in the chamber 10, the controller 40c instructs the power controller 36e to adjust the frequency of the radio-frequency power RF1 to set the load side reactance to zero or bring the load side reactance close to zero. The load side reactance is specified from impedance $Z_1$. The controller 40c transmits an instruction to the power supply controller 36e directly or via the main controller 70. Specifically, when it is determined that plasma is not generated in the chamber 10, the controller 40c obtains a set frequency for setting the load side reactance to zero or bringing the load side reactance close to zero. The controller 40c transmits an instruction to the power supply controller 36e to adjust the frequency of the radio-frequency power RF1 to the obtained set frequency. The power supply controller 36e controls the oscillator 36a so as to adjust the frequency of the radio-frequency signal to be output to the set frequency instructed from the controller 40c. By adjusting the frequency of the radio-frequency signal output by the oscillator 36a to the set frequency, the frequency of the radio-frequency power RF1 is adjusted to the set frequency.

In the case where it is determined that plasma is not generated in the chamber 10 even though the frequency of the radio-frequency power RF1 is adjusted to the set frequency, the frequency of the radio-frequency power RF1 is further changed in order to determine the frequency of the radio-frequency power RF1 for generating plasma in the chamber 10. Specifically, when it is determined that plasma is not generated in the chamber 10 even though the frequency of the radio-frequency power RF1 is adjusted to the set frequency, the controller 40c instructs the power supply controller 36e to change the frequency of the radio-frequency power RF1. The power supply controller 36e controls the oscillator 36a so as to adjust the frequency of the radio-frequency signal to be output in response to the instruction from the controller 40c. By changing the frequency of the radio-frequency signal output by the oscillator 36a, the frequency of the radio-frequency power RF1 is also changed. In changing the frequency of the radio-frequency power RF1, the frequency of the radio-frequency power RF1 is swept within a predetermined range. Alternatively, in changing the frequency of the radio-frequency power RF1, the frequency of the radio-frequency power RF1 is sequentially set to a plurality of frequencies.

As described above, the controller 40c is configured to determine whether or not plasma is generated in the chamber 10. The controller 40c determines one or more parameters reflecting the generation of plasma in the chamber 10. The one or more parameters are one or more parameters selected from a phase difference $\varphi_1$, a magnitude $|Z_1|$ of impedance $Z_1$, a reflection coefficient $\Gamma_1$, the power level $Pf_1$ of a traveling wave, the power level $Pr_1$ of a reflected wave, the peak value $V_{pp1}$ of a voltage, and a light emission amount within the chamber. The controller 40c compares the one or more parameters with a corresponding threshold to determine whether or not plasma is generated. When a plurality of parameters are used, in the case where the result of comparison between all the plurality of parameters and the corresponding parameters indicates that plasma is generated in the chamber 10, it may be determined that plasma is generated in the chamber 10. Alternatively, when the result of comparison between one or more of the plurality of parameters and the corresponding parameters indicates that plasma is generated in the chamber 10, it may be determined that plasma is generated in the chamber 10.

The phase difference $\varphi_1$ is the phase difference between the voltage $V_1$ and the current $I_1$. The controller 40c may obtain the phase difference $\varphi_1$ by Equation (2) as follows.

$$\varphi_1 = \tan^{-1}(X_1/R_1) \quad (2)$$

$X_1$ and $R_1$ in Equation (2) are defined by Equation (3) as follows.

$$Z_1 = R_1 + jX_1 \quad (3)$$

In Equation (3), "j" is an imaginary number.

The controller 40c may obtain the reflection coefficient $\Gamma_1$ by Equation (4) as follows.

$$\Gamma_1 = (Z_1 - Z_{01})/(Z_1 + Z_{01}) \quad (4)$$

In Equation (4), $Z_{01}$ is a characteristic impedance of the power feeding line 43 and is generally 50Ω.

The power level $P_{f1}$ of the traveling wave is the power level of the traveling wave on the power feeding line 43. The power level $P_{r1}$ of the reflected wave is the power level of the reflected wave on the power feeding feed line 43. The controller 40c may obtain the power level $P_{f1}$ of the traveling wave by Equation (5) as follows. The controller 40c may obtain the power level $P_{r1}$ of the reflected wave by Equation (6) as follows.

$$P_{f1} = P_1/(1-|\Gamma_1|^2) \quad (5)$$

$$P_{r1} = |\Gamma_1|^2 P_1/(1-|\Gamma_1|^2) \quad (6)$$

In Equations (5) and (6), $P_1$ is a difference between the power level of a traveling wave and the power level of a reflected wave, that is, the level of load power. The level $P_1$ of the load power is defined by Equation (7) as follows.

$$P_1 = Pf_1 - Pr_1 = V_1 I_1 \cos \varphi_1 \quad (7)$$

The peak value $V_{pp1}$ of the voltage is the peak value of the voltage on the power feeding line 43. The controller 40c may acquire the peak value $V_{pp1}$ from the voltage monitor 40v. The peak value $V_{pp1}$ is measured by the voltage monitor 40v. As illustrated in FIG. 4, the voltage monitor 40v obtains the peak value $V_{pp1}$ from the measured value of voltage divided by the voltage dividing circuit 40d. Further, the controller 40c may acquire the light emission amount within the chamber 10 from the optical sensor 74.

When it is determined that plasma is generated within the chamber 10, the controller 40c transmits an instruction to the power supply controller 36e to set the set frequency of the radio-frequency power $RF_1$ to the basic frequency $f_{B1}$. The power supply controller 36e controls the oscillator 36a to set the frequency of the radio-frequency signal to be output to the basic frequency $f_{B1}$ in response to the controller 40c. By setting the frequency of the radio-frequency signal output from the oscillator 36a to the basic frequency $f_{B1}$, the frequency of the radio-frequency power RF1 is set to the basic frequency $f_{B1}$. Further, when it is determined that plasma is generated within the chamber 10, the controller 40c controls the matching circuit 40a to match the load side impedance of the radio-frequency power supply 36 with the output impedance (matching point) of the radio-frequency power supply 36.

As illustrated in FIG. 7, the radio-frequency power supply 38 includes an oscillator 38a, a power amplifier 38b, a power sensor 38c, and a power supply controller 38e. The power supply controller 38e is configured with a processor such as, for example, a CPU. The power supply controller 38e gives control signals to the oscillator 38a and the power amplifier 38b, respectively, using signals given from the main controller 70 and the power sensor 38c so as to control the oscillator 38a and the power amplifier 38b.

The signals given from the main controller 70 to the power supply controller 38e are a second power level setting signal and a second frequency setting signal. The second power level setting signal is a signal for designating the power level of the radio-frequency power RF2, and the second frequency setting signal is a signal for designating the setting frequency of the radio-frequency power RF2.

The power supply controller 38e controls the oscillator 38a so as to output a radio-frequency signal having the set frequency designated by the second frequency setting signal. The output of the oscillator 38a is connected to the input of the power amplifier 38b. The radio-frequency signal output from the oscillator 38a is input to the power amplifier 38b. The power amplifier 38b amplifies the input radio-frequency signal so as to generate the radio-frequency power RF2 having the power level designated by the second power level setting signal from the input radio-frequency signal. The power amplifier 38b outputs the generated radio-frequency power RF2.

A power sensor 38c is provided in a rear stage of the power amplifier 38b. The power sensor 38c has a directional coupler, a traveling wave detector, and a reflected wave detector. In the power sensor 38c, the directional coupler gives a part of the traveling wave of the radio-frequency power RF2 to the traveling wave detector, and gives the reflected wave to the reflected wave detector. To the power sensor 38c, a signal specifying the frequency of the radio-frequency power RF2 is given from the power supply controller 38e. The traveling wave detector of the power sensor 38c generates the measured value of the power level of the component having the same frequency as the set frequency of the radio-frequency power RF2 among all the frequency components of the traveling wave, that is, the measured value $P_{f21}$ of the power level of the traveling wave. The measured value $P_{f21}$ is given to the power supply controller 38e for power feedback.

The reflected wave detector of the power sensor 38c generates the measured value of the power level of the component having the same frequency as the frequency of the radio-frequency power RF2 among all the frequency components of the reflected wave, that is, the measured value $P_{r21}$ of the power level of the reflected wave. The reflected wave detector of the power sensor 38c generates a measured value of the total power level of all the frequency components of the reflected wave, that is, the measured value of the power level of the reflected wave. The measured value $P_{r21}$ is given to $P_{r22}$ the main controller 70 for monitor display. The measured value $P_{r22}$ is given to the power supply controller 38e for protection of the power amplifier 38b.

The matching device 42 includes a matching circuit 42a, a sensor 42b, a controller 42c, a voltage dividing circuit 42d, and a voltage monitor 42v. The matching circuit 42a is an electronically controlled matching circuit. As illustrated in FIG. 8, the matching circuit 42a includes a plurality of series circuits 421 (first series circuits) and a plurality of series circuits 422 (second series circuits).

The plurality of series circuits 421 are connected in parallel to each other. In the example illustrated in FIG. 8, the plurality of series circuits 421 are connected in parallel between a node between the radio-frequency power supply 38 and the load side electrode (the lower electrode) and the ground. Each of the plurality of series circuits 421 includes a capacitor 421c and a switching element 421s. The capacitor 421c and the switching element 421s are connected in series. The switching element 421s is, for example, a PIN diode.

The plurality of series circuits 422 are connected in parallel to each other. In the example illustrated in FIG. 8, the plurality of series circuits 422 are connected in parallel between the radio-frequency power supply 38 and the load side electrode (the lower electrode). In a separate example, the plurality of series circuits 422 are connected in parallel between a separate node between the radio-frequency power supply 38 and the load side electrode (the lower electrode) and the ground. Each of the plurality of series circuits 422 includes a capacitor 422c and a switching element 422s. The capacitor 422c and the switching element 422s are connected in series. The switching element 422s is, for example, a PIN diode. The matching circuit 42a may further include, for example, an inductor.

Refer back to FIG. 7. The controller 42c is configured with, for example, a processor. The controller 42c operates under the control of the main controller 70. The controller 42c uses the measured value given from the sensor 42b.

As illustrated in FIG. 9, the sensor 42b includes a current detector 102B, a voltage detector 104B, a filter 106B, and a filter 108B. The voltage detector 104B detects a voltage waveform of the radio-frequency power RF2 transmitted on the power feeding line 45, and outputs a voltage waveform analog signal indicating the voltage waveform. This voltage waveform analog signal is input to the filter 106B. The filter 106B generates a voltage waveform digital signal by digitizing the input voltage waveform analog signal. Then, the filter 106B extracts only the component of the set frequency of the radio-frequency power RF2 specified by the signal from the main controller 70 from the voltage waveform digital signal, thereby generating a filtered voltage waveform signal. The filtered voltage waveform signal generated by the filter 106B is applied to the controller 42c. In addition, the filter 106B is configured with, for example, a field programmable gate array (FPGA).

The current detector 102B detects a current waveform of the radio-frequency power RF2 transmitted on the power feeding line 45, and outputs a voltage waveform analog signal indicating the current waveform. This current waveform analog signal is input to the filter 108B. The filter 108B generates a current waveform digital signal by digitizing the input current waveform analog signal. Then, the filter 108B extracts only the component of the set frequency of the radio-frequency power RF1 specified by the signal from the main controller 70 from the current waveform digital signal, thereby generating a filtered current waveform signal. The filtered current waveform signal generated by the filter 108B is applied to the controller 42c. In addition, the filter 108B is configured with, for example, a field programmable gate array (FPGA).

Refer back to FIG. 7. The controller 42c is configured to determine the load side impedance of the radio-frequency power supply 38 (hereinafter, referred to as "impedance $Z_2$"). The controller 42c controls the plurality of switching elements 421s and the plurality of switching elements 422s of the matching circuit 42a such that the obtained impedance $Z_2$ approaches the output impedance (matching point) of the radio-frequency power supply 38.

The controller 42c obtains the impedance $Z_2$ using the filtered voltage waveform signal given from the filter 106B and the filtered current waveform signal given from the filter 108A. Specifically, the controller 42c obtains the impedance $Z_2$ based on Equation (8) as follows.

$$Z_1 = V_1/I_1 \tag{8}$$

In Equation (8), $V_2$ is the voltage specified by the filtered voltage waveform signal given from the filter 106B, and $I_2$ is the current specified by the filtered current waveform signal given from the filter 108B.

The controller 42c is configured to determine whether or not plasma is generated in the chamber 10 during the supply of the radio-frequency power RF2 from the radio-frequency power supply 38. That is, the controller 42c is configured to determine whether or not plasma is generated in the chamber 10 after the supply of the radio-frequency power RF2 from the radio-frequency power supply 38 is initiated and the radio-frequency power RF2 is detected by the sensor 42b.

When it is determined that no plasma is generated in the chamber 10, the controller 42c instructs the power controller 38e to adjust the frequency of the radio-frequency power RF2 to set the load side reactance to zero or bring the load side reactance close to zero. The load side reactance is specified from impedance $Z_2$. The controller 42c transmits an instruction to the power supply controller 38e directly or via the main controller 70. Specifically, when it is determined that plasma is not generated in the chamber 10, the controller 42c obtains a set frequency for setting the load side reactance to zero or bringing the load side reactance close to zero. The controller 42c transmits an instruction to the power supply controller 38e to adjust the frequency of the radio-frequency power RF2 to the obtained set frequency. The power supply controller 38e controls the oscillator 38a so as to adjust the frequency of the radio-frequency signal to be output to the set frequency instructed from the controller 42c. By adjusting the frequency of the radio-frequency signal output by the oscillator 38a to the set frequency, the frequency of the radio-frequency power RF2 is adjusted to the set frequency.

In the case where it is determined that plasma is not generated in the chamber 10 even though the frequency of the radio-frequency power RF2 is adjusted to the set frequency, the frequency of the radio-frequency power RF2 is further changed in order to determine the frequency of the radio-frequency power RF2 for generating plasma in the chamber 10. Specifically, when it is determined that plasma is not generated in the chamber 10 even though the frequency of the radio-frequency power RF2 is adjusted to the set frequency, the controller 42c instructs the power supply controller 38e to change the frequency of the radio-frequency power RF2. The power supply controller 38e controls the oscillator 38a so as to adjust the frequency of the radio-frequency signal to be output in response to the instruction from the controller 42c. By changing the frequency of the radio-frequency signal output by the oscillator 38a, the frequency of the radio-frequency power RF2 is also changed. In changing the frequency of the radio-frequency power RF2, the frequency of the radio-frequency power RF2 is swept within a predetermined range. Alternatively, in changing the frequency of the radio-frequency power RF2, the frequency of the radio-frequency power RF2 is sequentially set to a plurality of frequencies.

As described above, the controller 42c is configured to determine whether or not plasma is generated in the chamber 10. The controller 42c determines one or more parameters reflecting the generation of plasma in the chamber 10. The one or more parameters are one or more parameters selected from a phase difference $\varphi_2$, a magnitude $|Z_2|$ of impedance $Z_2$, a reflection coefficient $\Gamma_2$, the power level $Pf_2$ of a traveling wave, the power level $Pr_2$ of a reflected wave, the peak value $V_{pp2}$ of a voltage, and a light emission amount within the chamber. The controller 42c compares the one or more parameters with a corresponding threshold to determine whether or not plasma is generated. When a plurality of parameters are used, in the case where the result of comparison between all the plurality of parameters and the corresponding parameters indicates that plasma is generated in the chamber 10, it may be determined that plasma is generated in the chamber 10. Alternatively, when the result of comparison between one or more of the plurality of parameters and the corresponding parameters indicates that plasma is generated in the chamber 10, it may be determined that plasma is generated in the chamber 10.

The phase difference $\varphi_2$ is the phase difference between the voltage $V_2$ and the current $I_2$. The controller 42c may obtain the phase difference $\varphi_2$ by Equation (9) as follows.

$$\varphi_2 = \tan^{-1}(X_2/R_2) \tag{9}$$

$X_2$ and $R_2$ in Equation (9) are defined by Equation (10) as follows.

$$Z_2 = R_2 + jX_2 \tag{10}$$

In Equation (10), "j" is an imaginary number.

The controller 42c may obtain the reflection coefficient $\Gamma_2$ by Equation (11) as follows.

$$\Gamma_2 = (Z_2 - Z_{02})/(Z_2 + Z_{02}) \tag{11}$$

In Equation (11), $Z_{O2}$ is the characteristic impedance of the power feeding line 45 and is generally 50Ω.

The power level $P_E$ of the traveling wave is the power level of the traveling wave on the power feeding line 45. The power level $P_{r2}$ of the reflected wave is the power level of the reflected wave on the power feeding feed line 45. The controller 42c may obtain the power level $P_{f2}$ of the traveling wave by Equation (12) as follows. The controller 42c may obtain the power level $P_{r2}$ of the reflected wave by Equation (13) as follows.

$$P_{f2} = P_2/(1-|\Gamma_2|^2) \quad (12)$$

$$P_{r2} = |\Gamma_2|^2 P_2/(1-|\Gamma_2|^2) \quad (13)$$

In Equations (12) and (13), $P_2$ is a difference between the power level of a traveling wave and the power level of a reflected wave, that is, the level of load power. The level $P_2$ of the load power is defined by Equation (14) as follows.

$$P_2 = Pf_2 - Pr_2 = V_2 I_2 \cos \varphi_2 \quad (14)$$

The peak value $V_{pp2}$ of the voltage is the peak value of the voltage on the power feeding line 45. The controller 42c may acquire the peak value $V_{pp2}$ from the voltage monitor 42v. The peak value $V_{pp2}$ is measured by the voltage monitor 42v. As illustrated in FIG. 7, the voltage monitor 42v obtains the peak value $V_{pp2}$ from the measured value of voltage divided by the voltage dividing circuit 42d. Further, the controller 42c may acquire the light emission amount within the chamber 10 from the optical sensor 74.

When it is determined that plasma is generated within the chamber 10, the controller 42c transmits an instruction to the power supply controller 38e to set the set frequency of the radio-frequency power $RF_2$ to the basic frequency $f_{B2}$. The power supply controller 38e controls the oscillator 38a to set the frequency of the radio-frequency signal to be output to the basic frequency $f_{B2}$ in response to the controller 42c. By setting the frequency of the radio-frequency signal output from the oscillator 38a to the basic frequency $f_{B2}$, the frequency of the radio-frequency power RF2 is set to the basic frequency $f_{B2}$. Further, when it is determined that plasma is generated within the chamber 10, the controller 42c controls the matching circuit 42a to match the load side impedance of the radio-frequency power supply 38 with the output impedance (matching point) of the radio-frequency power supply 38.

Hereinafter, with reference to FIGS. 1 and 2 again, method MT will be described by taking the case where method MT is applied to the plasma processing apparatus 1 as an example. In the following description, method MT will be described by taking the case where the radio-frequency power supply 36, the matching device 40, the radio-frequency power supply 38, and the matching device 42 are used for plasma generation as an example.

Method MT is executed in the state in which a gas is supplied to the inner space of the chamber 10 and the pressure in the inner space of the chamber 10 is reduced to a designated pressure by the exhaust device 66. As illustrated in FIG. 1, method MT is initiated in step ST1. In step ST1, the supply of the radio-frequency power RF1 and the radio-frequency power RF2 is initiated. In step ST1, the frequency of the radio-frequency power RF1 is set to the basic frequency $f_{B1}$, and the frequency of the radio-frequency power RF2 is set to the basic frequency $f_{B2}$. The radio-frequency power RF1 is supplied from the radio-frequency power supply 36 to the lower electrode via the matching device 40. The radio-frequency power RF1 may be supplied to the upper electrode 46 via the matching device 40. The radio-frequency power RF2 is supplied from the radio-frequency power supply 38 to the lower electrode via the matching device 42.

In the subsequent step ST2, the radio-frequency power RF1 and the radio-frequency power RF2 are detected. The radio-frequency power RF1 is detected by the controller 40c. The controller 40c may detect the power $R_{F1}$ by comparing one or more of the parameters such as, for example, the above-described measured value of the sensor 40b, the power level $P_{f1}$ of the traveling wave, the level $P_1$ of the load power, and the crest value $V_{pp1}$ of the voltage, to corresponding threshold values. The radio-frequency power RF2 is detected by the controller 42c. The controller 42c may detect the power $R_{F2}$ by comparing one or more of the parameters such as, for example, the above-described measured value of the sensor 42b, the power level $P_{f2}$ of the traveling wave, the level $P_2$ of the load power, and the crest value $V_{pp2}$ of the voltage, to corresponding threshold values.

When the radio-frequency power RF1 and the radio-frequency power RF2 are detected, the subsequent step ST3 is executed. In step ST3, in order to determine whether or not plasma is generated within the chamber 10 in the following step ST4, one or more of the above-described parameters are acquired by the controller 40c, and one or more of the above-described parameters are acquired by the controller 42c. The one or more parameters acquired by the controller 40c are one or more parameters selected from a phase difference $\varphi_1$, a magnitude $|Z_1|$ of impedance $Z_1$, a reflection coefficient $\Gamma_1$, the power level $Pf_1$ of a traveling wave, the power level $P_{r1}$ of a reflected wave, the peak value $V_{pp1}$ of a voltage, and a light emission amount within the chamber. The one or more parameters acquired by the controller 42c are one or more parameters selected from a phase difference $\varphi_2$, a magnitude $|Z_2|$ of impedance $Z_2$, a reflection coefficient $\Gamma_2$, the power level $Pf_2$ of a traveling wave, the power level $P_{r2}$ of a reflected wave, the peak value $V_{pp2}$ of a voltage, and a light emission amount within the chamber.

In the subsequent step ST4, it is determined whether or not plasma is generated within the chamber 10. Specifically, in step ST4, the controller 40c determines whether or not plasma is generated by comparing the one or more parameters obtained in step ST3 with corresponding threshold values by the controller 40c. In addition, the controller 42c determines whether or not plasma is generated by comparing the one or more parameters obtained in step ST3 with the corresponding threshold values.

When it is determined that plasma is generated in step ST4, step ST5 is executed. In step ST5, the controller 40c controls the matching circuit 40a to match the load side impedance (impedance $Z_1$) of the radio-frequency power supply 36 with the output impedance (matching point) of the radio-frequency power supply 36. In step ST5, the controller 42c controls the matching circuit 42a to match the load side impedance (impedance $Z_2$) of the radio-frequency power supply 38 with the output impedance (matching point) of the radio-frequency power supply 38. In method MT, a plasma processing is performed in the state in which plasma is generated. After the execution of the plasma processing, method MT is terminated.

Meanwhile, when it is determined that plasma is not generated in step ST4, step ST11 is executed. In step ST11, the frequencies of the radio-frequency power RF1 and the radio-frequency power RF2 are adjusted. Specifically, in step ST11, the controller 40c instructs the power supply controller 36e to adjust the frequency of the radio-frequency power RF1 to set the load side reactance $X_1$ to zero or bring the load side reactance $X_1$ close to zero. More specifically, in step ST11, the controller 40c determines a setting frequency for setting the load side reactance $X_1$ to zero or bringing the load side reactance $X_1$ close to zero. The controller 40c transmits an instruction to the power supply controller 36e to adjust the frequency of the radio-frequency power RF1 to the obtained set frequency. The power supply controller 36e controls the oscillator 36a so as to adjust the frequency of the radio-frequency signal to be output to the set frequency instructed from the controller 40c. By adjusting the frequency of the radio-frequency signal output by the oscillator 36a to the set frequency, the frequency of the radio-frequency power RF1 is adjusted to the set frequency.

Specifically, in step ST11, the controller 42c instructs the power supply controller 38e to adjust the frequency of the radio-frequency power RF2 to set the load side reactance $X_2$ to zero or bring the load side reactance $X_2$ close to zero. More specifically, in step ST11, the controller 42c determines a setting frequency for setting the load side reactance $X_2$ to zero or bringing the load side reactance $X_1$ close to zero. The controller 42c transmits an instruction to the power supply controller 38e to adjust the frequency of the radio-frequency power RF2 to the obtained set frequency. The power supply controller 38e controls the oscillator 38a so as to adjust the frequency of the radio-frequency signal to be output to the set frequency instructed from the controller 42c. By adjusting the frequency of the radio-frequency signal output by the oscillator 38a to the set frequency, the frequency of the radio-frequency power RF2 is adjusted to the set frequency.

Following step ST11, step ST12 is executed. In step ST12, as in step ST3, one or more of the above-described parameters are acquired by the controller 40c, and one or more of the above parameters are acquired by the controller 42c.

Following step ST12, step ST13 is executed. In step ST13, as in step ST4, the controller 40c and the controller 42c determine whether or not plasma is generated within the chamber 10.

When it is determined that plasma is generated in step ST13, step ST14 is executed. In step ST14, the frequency of the radio-frequency power RF1 is set to the basic frequency $f_{B1}$, and the frequency of the radio-frequency power RF2 is set to the basic frequency $f_{B2}$. The frequency of the radio-frequency power RF1 is controlled by the power supply controller 36e in response to an instruction from the controller 40c. The frequency of the radio-frequency power RF2 is controlled by the power supply controller 38e in response to an instruction from the controller 42c. After step ST14 is executed, the processing proceeds to step ST5.

Meanwhile, when it is determined that plasma is not generated in step ST13, step ST21 is executed. In step ST21, in order to determine the frequency of the radio-frequency power RF1 for generating plasma within the chamber 10, the frequency of the radio-frequency power RF1 is changed, and the frequency of the radio-frequency power RF2 is changed.

Specifically, in step ST21, the controller 40c instructs the power supply controller 36e to change the frequency of the radio-frequency power RF1. The power supply controller 36e controls the oscillator 36a so as to adjust the frequency of the radio-frequency signal to be output in response to the instruction from the controller 40c. By changing the frequency of the radio-frequency signal output by the oscillator 36a, the frequency of the radio-frequency power RF1 is also changed. In addition, the controller 42c instructs the power supply controller 38e to change the frequency of the radio-frequency power RF2. The power supply controller 38e controls the oscillator 38a so as to adjust the frequency of the radio-frequency signal to be output in response to the instruction from the controller 42c. By changing the frequency of the radio-frequency signal output by the oscillator 38a, the frequency of the radio-frequency power RF2 is also changed.

In step ST22 executed following step ST21, as in step ST3, one or more of the above-described parameters are acquired by the controller 40c, and one or more of the above parameters are acquired by the controller 42c.

In step ST23 executed following step 22, as in step ST4, the controller 40c and the controller 42c determine whether or not plasma is generated within the chamber 10.

When it is determined that plasma is generated in step ST23, step ST24 is executed. In step ST24, the frequency of the radio-frequency power RF1 is set to the basic frequency $f_{B1}$, and the frequency of the radio-frequency power RF2 is set to the basic frequency $f_{B2}$. The frequency of the radio-frequency power RF1 is controlled by the power supply controller 36e in response to an instruction from the controller 40c. The frequency of the radio-frequency power RF2 is controlled by the power supply controller 38e in response to an instruction from the controller 42c. After step ST24 is executed, the processing proceeds to step ST5.

Meanwhile, when it is determined that plasma is not generated in step ST23, step ST25 is executed. In step ST25, it is determined whether or not change of the frequencies of the radio-frequency power RF1 and the radio-frequency power RF2 is terminated. In an embodiment, in repeating the sequence including step ST21, step ST22, step ST23, and step ST25, the frequency of the radio-frequency power RF1 is swept within a predetermined range, and the frequency of the radio-frequency power RF2 is swept within another predetermined range to determine whether or not plasma is generated. In this embodiment, in step ST25, when the sweep of the frequency of the radio-frequency power RF1 is not completed or the sweep of the frequency of the radio-frequency power RF2 is not completed, it is determined that the change of the frequencies of the radio-frequency power RF1 and the frequency of the radio-frequency power RF2 is not terminated. When the sweep of the frequency of the radio-frequency power RF1 is completed and the sweep of the frequency of the radio-frequency power RF2 is completed, it is determined that the change of the frequencies of the radio-frequency power RF1 and the radio-frequency power RF2 is terminated.

In another embodiment, in repeating the sequence including step ST21, step ST22, step ST23, and step ST25, the frequency of the radio-frequency power RF1 is sequentially set to a plurality of frequencies, and the frequency of the radio-frequency power RF2 is set to a plurality of different frequencies to determine whether or not plasma is generated. In this embodiment, in step ST25, when the change of the frequency of the radio-frequency power RF1 to the plurality of frequencies is not completed or the change of the frequency of the radio-frequency power RF2 to the plurality of different frequencies is not completed, it is determined that the change of the frequencies of the radio-frequency power RF1 and the frequency of the radio-frequency power RF2 is not terminated. When the change of the frequency of the radio-frequency power RF1 to the plurality of frequencies is completed and the change of the frequency of the radio-frequency power RF2 to the plurality of frequencies is completed, it is determined that the change of the frequencies of the radio-frequency power RF1 and the radio-frequency power RF2 is terminated.

When it is determined in step ST25 that the change of the frequency of the radio-frequency power RF1 and the frequency of the radio-frequency power RF2 is not terminated, step ST21 is executed again. Meanwhile, when it is determined in step ST25 that the change of the frequency of the radio-frequency power RF1 and the frequency of the radio-frequency power RF2 is terminated, step ST31 is executed.

In step ST31, the frequency of the radio-frequency power RF1 is set to the basic frequency $f_{B1}$, and the frequency of the radio-frequency power RF2 is set to the basic frequency $f_{B2}$. The frequency of the radio-frequency power RF1 is controlled by the power supply controller 36e in response to an instruction from the controller 40c. The frequency of the radio-frequency power RF2 is controlled by the power supply controller 38e in response to an instruction from the controller 42c.

In step ST31, in step 32 executed following step 31, as in step ST5, the matching circuit 40a is controlled to match the load side impedance (impedance $Z_1$) of the radio-frequency power supply 36 with the output impedance (matching point) of the radio-frequency power supply 36. In step ST32, the matching circuit 42a is controlled to match the load side impedance (impedance $Z_2$) of the radio-frequency power supply 38 with the output impedance (matching point) of the radio-frequency power supply 38.

In step ST33 executed following step ST32, as in step ST3, one or more of the above-described parameters are acquired by the controller 40c, and one or more of the above parameters are acquired by the controller 42c.

In step ST34 executed following step 33, as in step ST4, the controller 40c and the controller 42c determine whether or not plasma is generated within the chamber 10. When it is determined that plasma is not generated in step ST34, in step ST41, method is stopped by an error. Meanwhile, when it is determined that plasma is generated in step ST34, a plasma processing is executed in the state where the plasma is generated. Then, after the execution of the plasma processing, method MT is terminated.

In method MT, when a phenomenon in which plasma is not generated within the chamber 10 occurs, the frequency of the radio-frequency power RF1 is adjusted to set the load side reactance $X_1$ of the radio-frequency power supply 36 to zero or to bring the load side reactance $X_1$ close to zero. In addition, when the phenomenon in which plasma is not generated within the chamber 10 occurs, the frequency of the radio-frequency power RF2 is adjusted to set the load side reactance $X_2$ of the radio-frequency power supply 38 to zero or to bring the load side reactance $X_2$ close to zero. Each of the radio-frequency power supply 36 and the radio-frequency power supply 38 is capable of adjusting the frequency of the radio-frequency power at high speed. Accordingly, when the phenomenon in which plasma is not generated occurs, the reflection of the radio-frequency power RF1 and the radio-frequency power RF2 is suppressed within a short time.

While various embodiments have been described above, various modifications can be made without being limited to the above-described embodiments. For example, in the above description, while method MT is applied to the plasma processing apparatus 1, method MT may be applied to any plasma processing apparatus configured to supply radio-frequency power from a radio-frequency power supply to the electrode. As such a plasma processing apparatus, for example, an inductively coupled plasma processing apparatus is exemplified.

In addition, in method MT, only one of the set of the radio-frequency power supply 36 and the matching device 40 and the set of the radio-frequency power supply 38 and the matching device 42 may be used for plasma generation.

In this case, respective steps after the step ST2 of method MT are executed by the radio-frequency power supply and the matching device included in one set. In the case where both the set of the radio-frequency power supply 36 and the matching device 40 and the set of the radio-frequency power supply 38 and the matching device 42 are used for plasma generation, the respective steps after step ST2 may be executed only by the set of the radio-frequency power supply 36 and the matching device 40.

As described above, when a phenomenon in which plasma is not generated occurs, it is possible to suppress the reflection of radio-frequency power within a short time.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma generating method comprising:
   providing a plasma processing apparatus including a chamber; a radio-frequency power supply; an electrode electrically connected to the radio-frequency power supply to generate plasma within the chamber; and a matching device provided between the radio-frequency power supply and the electrode in order to match a load side impedance of the radio-frequency power supply with an output impedance of the radio-frequency power supply, the matching device including a plurality of first series circuits connected in parallel to each other and each including a capacitor and a switching element connected to the capacitor in series, and a plurality of second series circuits connected in parallel to each other and each including a capacitor and a switching element connected to the capacitor in series;
   supplying radio-frequency power to the electrode via the matching device from the radio-frequency power supply in order to generate plasma within the chamber;
   determining whether or not plasma is generated within the chamber from one or more parameters reflecting plasma generation within the chamber during the supplying the radio-frequency power;
   matching the load side impedance with the output impedance of the radio-frequency power by the matching device; and
   when it is determined that plasma is not generated within the chamber in the determining, adjusting a frequency of the radio-frequency power output from the radio-frequency power supply so as to set the load side reactance of the radio-frequency power supply to zero or to bring the load side reactance close to zero.

2. The plasma generating method of claim 1, further comprising:
   changing the frequency of the radio-frequency power output from the radio-frequency power supply and determining the frequency of the radio-frequency power that generates plasma within the chamber, when it is determined that plasma is not generated within the chamber from the one or more parameters after the adjusting the frequency of the radio-frequency power.

3. The plasma generating method of claim 2, wherein, in the changing the frequency of the radio-frequency power, the frequency is swept.

4. The plasma generating method of claim 2, wherein, in the changing the frequency of the radio-frequency power, the frequency is sequentially set to a plurality of frequencies.

5. The plasma generating method of claim 4, wherein the one or more parameters are one or more parameters selected from a peak value of a power of the radio-frequency power, a phase difference between a voltage and a current of the radio-frequency power, a magnitude of the load side impedance, a power level of a traveling wafer, a power level of a reflected wave, and a light emission amount within the chamber.

6. The plasma generating method of claim 1, wherein the one or more parameters are one or more parameters selected from a peak value of a power of the radio-frequency power, a phase difference between a voltage and a current of the radio-frequency power, a magnitude of the load side impedance, a power level of a traveling wafer, a power level of a reflected wave, and a light emission amount within the chamber.

* * * * *